United States Patent
Chang et al.

(10) Patent No.: US 6,715,134 B2
(45) Date of Patent: Mar. 30, 2004

(54) METHOD AND APPARATUS TO FACILITATE GENERATING SIMULATION MODULES FOR TESTING SYSTEM DESIGNS

(75) Inventors: Victor A. Chang, Palo Alto, CA (US); William Lam, Newark, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 152 days.

(21) Appl. No.: 10/090,651

(22) Filed: Mar. 4, 2002

(65) Prior Publication Data

US 2003/0167450 A1 Sep. 4, 2003

(51) Int. Cl.$^7$ ................................................ G06F 17/50
(52) U.S. Cl. ................. 716/4; 716/2; 716/5; 379/10.03
(58) Field of Search ............................ 714/712; 716/2, 716/4, 5; 379/10.03

(56) References Cited

U.S. PATENT DOCUMENTS 6,011,830 A * 1/2000 Sasin et al. ............... 379/10.03
6,405,330 B1 * 6/2002 Hanf et al. ................ 714/712

* cited by examiner

*Primary Examiner*—Vuthe Siek
*Assistant Examiner*—Thuan Do
(74) *Attorney, Agent, or Firm*—Park, Vaughan & Fleming LLP

(57) ABSTRACT

One embodiment of the present invention provides a system that facilitates generating a simulation module for testing a system design. The system operates by receiving a system specification, which specifies correct behavior for modules within the system design. The system also receives modules that are individually designed to this system specification. The system then compares the modules with the system specification to identify nonfunctioning modules that can include either missing modules or incorrect modules. The system also determines an interface for the nonfunctioning modules from the system specification, which specifies input and output requirements for these nonfunctioning modules. The system then generates the simulation module. This simulation module can function in place of the nonfunctioning module and can simulate a functionality assigned to the nonfunctioning module.

24 Claims, 4 Drawing Sheets

METHOD AND APPARATUS TO FACILITATE GENERATING SIMULATION MODULES FOR TESTING SYSTEM DESIGNS

BACKGROUND

1. Field of the Invention

The present invention relates to testing system designs. More specifically, the present invention relates to a method and an apparatus to facilitate generating simulation modules for testing system designs.

2. Related Art

Designing and implementing a large system such as a modern integrated circuit device typically involves testing at many stages during development. To be effective, this testing examines a snapshot of the entire system so that a test engineer can evaluate the operation of the various components or modules within the system, and the interactions of these modules with each other and with the external interface.

The many designers involved in creating the modules take different amounts of time to complete the modules because of the differences in the complexity of the individual modules. It is, therefore, difficult to create a snapshot of the system until all of the components have been completed and the maturity rules, such as using only permissible gates, have been met.

Testing a system prior to the completion of all modules can involve creating higher-level representations of immature or missing modules that simulate the responses of these nonfunctioning modules. Creating these higher-level representations of simulation modules is a time-consuming manual process.

In this manual process, a test engineer must first identify the nonfunctioning modules within the system. Next, the test engineer typically determines the interfaces—the inputs, outputs, and intermodule communications—to the nonfunctioning module. After determining these interfaces, the test engineer creates a substitute or simulation module, which exhibits the identical responses as the module being replaced when the simulation module is supplied with an input stimulus. While simulation modules are effective for making a testable system, the time and resources expended in creating these simulation modules is a significant burden on the designers.

What is needed is a method and an apparatus to facilitate generating simulation modules for testing system designs without the problems described above.

SUMMARY

One embodiment of the present invention provides a method that facilitates generating a simulation module for testing a system design. The method operates by receiving a system specification, which specifies correct behavior for modules within the system design. The method also receives modules that are individually designed to this system specification. The method then compares the modules with the system specification to identify nonfunctioning modules that can include either missing modules or incorrect modules. The method also determines an interface for the nonfunctioning modules from the system specification, which specifies input and output requirements for these nonfunctioning modules. The method then generates the simulation module. This simulation module can function in place of the nonfunctioning module and can simulate a functionality assigned to the nonfunctioning module.

In one embodiment of the present invention, the development is in two or more specification languages. In this case, the simulation module is written in a specification language that is different from the original description so that the compilation stage can be passed. Examples of different specification languages include VHDL and Verilog for circuit design and C and C++ for software design.

In one embodiment of the present invention, the design is partitioned into multiple blocks, each block being assigned to a different processor for compilation. Typically, the processors are fully compatible, however, if this is not the case, the system generates adaptors and correct scheduling for each binary object that will be interacting during the simulation phase.

In one embodiment of the present invention, the method receives a list of test vectors. The method applies this list of test vectors to the system specification, and captures the response of the system specification to this list of test vectors. The method simulates the response to the list of test vectors within the simulation module.

In one embodiment of the present invention, the method replaces the nonfunctioning module with the simulation module. Next, the method compiles the functioning modules and the simulation module into an executable system. The method then executes this executable system to allow testing of the completed modules.

In one embodiment of the present invention, the method tests the executable system with the list of test vectors.

In one embodiment of the present invention, capturing the response of the system specification to the list of test vectors includes capturing an output of the system specification to a specified input test stimulus.

In one embodiment of the present invention, the nonfunctioning module can be identified manually.

In one embodiment of the present invention, the interface for the nonfunctioning module includes input/output and inter-module data transfers.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Test System 102

Figure 1:
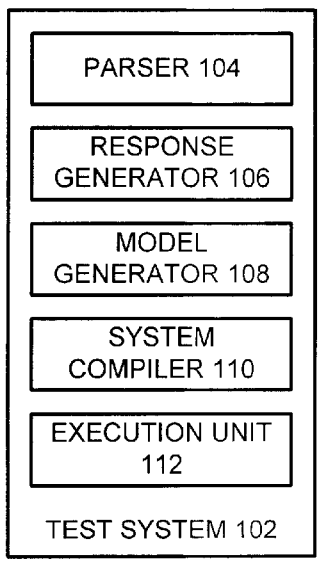
FIG. 1 illustrates test system 102 in accordance with an embodiment of the present invention.

FIG. 1 illustrates test system 102 in accordance with an embodiment of the present invention. Test system 102 can generally include any type of computer system, including, but not limited to, a computer system based on a microprocessor, a mainframe computer, a digital signal processor, a portable computing device, a personal organizer, a device controller, and a computational engine within an appliance.

Test system 102 includes parser 104, response generator 106, model generator 108, system compiler 110, and execution unit 112. Parser 104 parses files to determine nonfunctioning modules and their interfaces as described below in conjunction with FIG. 2. Response generator 106 captures expected system responses as described below in conjunction with FIG. 3. Model generator 108 generates simulation modules to replace nonfunctioning modules as described below in conjunction with FIG. 4. System compiler 110 compiles completed modules and simulation modules into a testable system as described below in conjunction with FIG. 5. Execution unit 112 executes the testable system created by system compiler 110 so that completed modules can be tested as described below in conjunction with FIG. 6.

Parser 104

Figure 2:
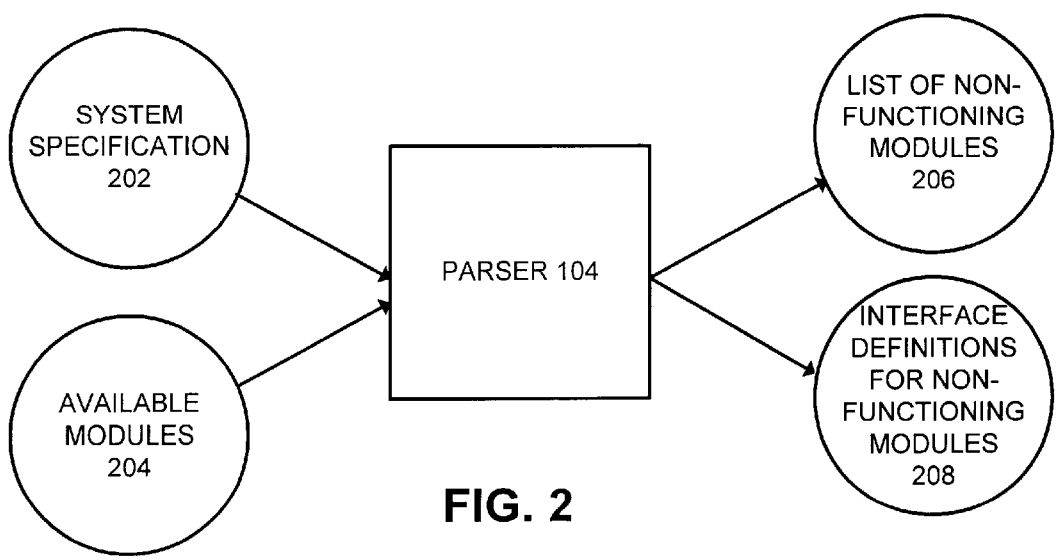
FIG. 2 illustrates parser 104 in accordance with an embodiment of the present invention.

FIG. 2 illustrates parser 104 in accordance with an embodiment of the present invention. In operation, parser 104 receives system specification 202 and available modules 204. System specification 202 includes a specification of the correct behavior of the system being designed and tested. Available modules 204 includes system components and modules that are available for testing. These available modules may be functional or nonfunctional. Nonfunctional modules may be incomplete or may violate a design rule such as by using a nonstandard component.

Parser 104 examines system specification 202 to determine what modules are required for the complete system. After determining these required modules, parser 104 compares available modules 204 to match available modules with the required modules. Any required modules, which are not available in available modules 204 or which are incorrect, are designated nonfunctioning modules.

Parser 104 then determines the interfaces to these nonfunctioning modules. The interfaces include inputs, outputs, and intermodule communication paths. Parser 104 then creates list of nonfunctioning modules 206 and interface definitions for nonfunctioning modules 208. List of nonfunctioning modules 206 lists the modules that have been designated as nonfunctioning modules, and interface definitions for nonfunctioning modules 208 describes the interfaces to these nonfunctioning modules.

Response Generator 106

Figure 3:
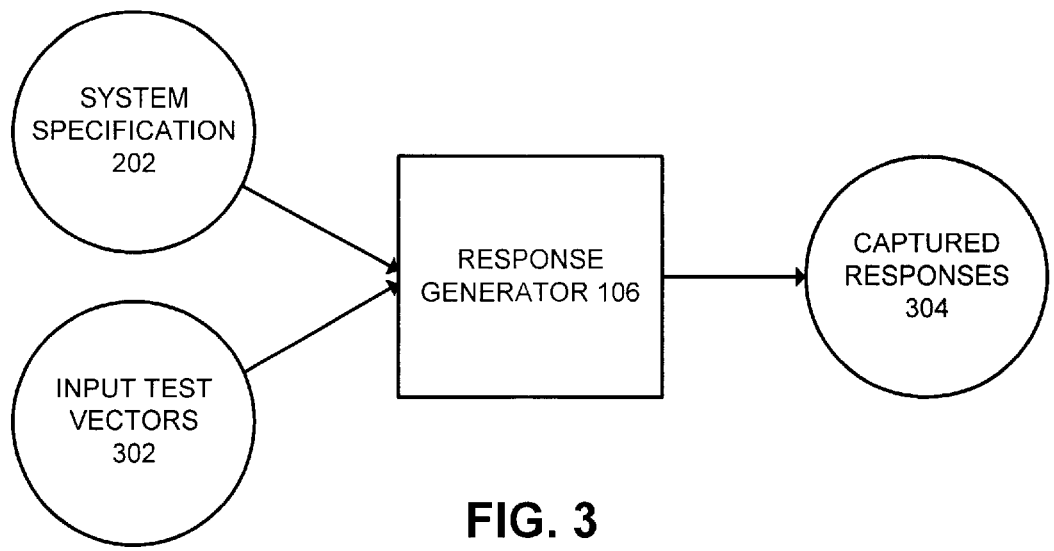
FIG. 3 illustrates response generator 106 in accordance with an embodiment of the present invention.

FIG. 3 illustrates response generator 106 in accordance with an embodiment of the present invention. Response generator 106 receives system specification 202 and input test vectors 302. System specification 202 was described above in conjunction with FIG. 3. Input test vectors 302 are generated by a test engineer in order to test the behavior of the system and to determine if the system responds correctly to a stimulus. Response generator 106 applies input test vectors 302 to system specification 202 to determine the correct responses to the stimuli within input test vectors 302. These correct responses are captured by response generator 106 and provided as captured responses 304.

Model Generator 108

Figure 4:
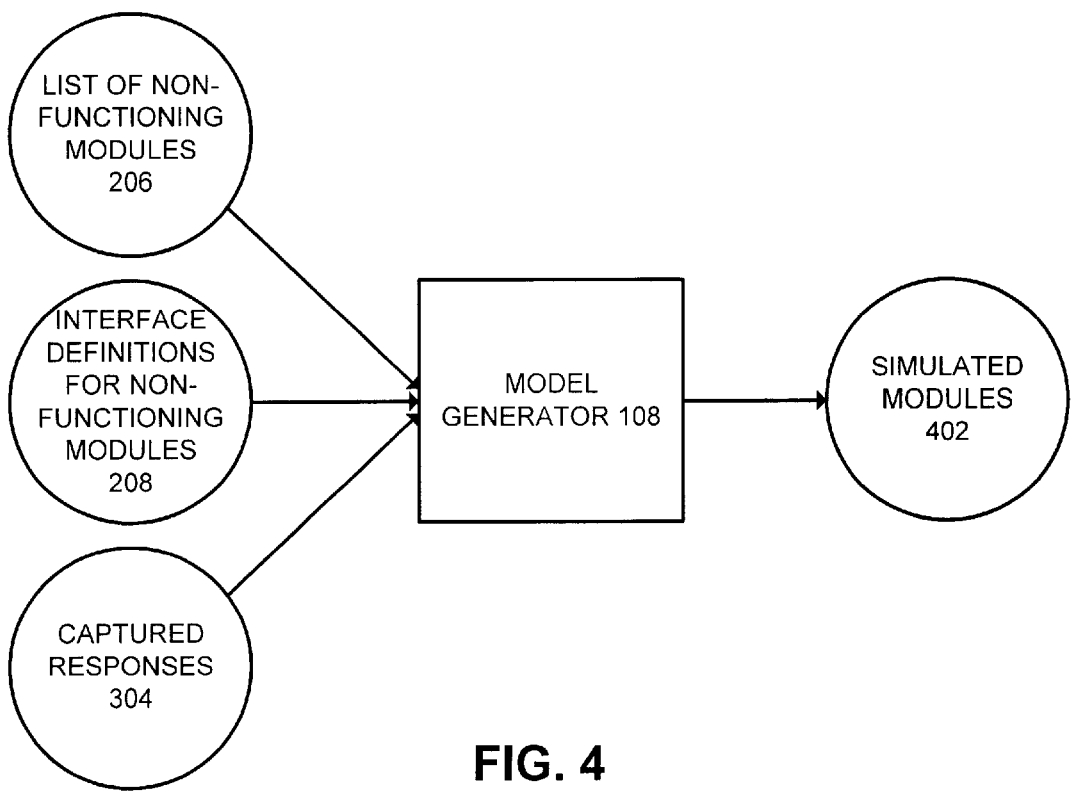
FIG. 4 illustrates model generator 108 in accordance with an embodiment of the present invention.

FIG. 4 illustrates model generator 108 in accordance with an embodiment of the present invention. Model generator 108 receives list of nonfunctioning modules 206 and interface definitions for nonfunctioning modules 208 from parser 104 and captured responses 304 from response generator 106. Model generator 108 uses these inputs to generate simulated modules 402. Simulated modules 402 provide a simulation of the correct outputs for given input stimuli. Simulated modules 402 are supplied to system compiler 110 to replace nonfunctioning modules as described below in conjunction with FIG. 5.

System Compiler 110

Figure 5:
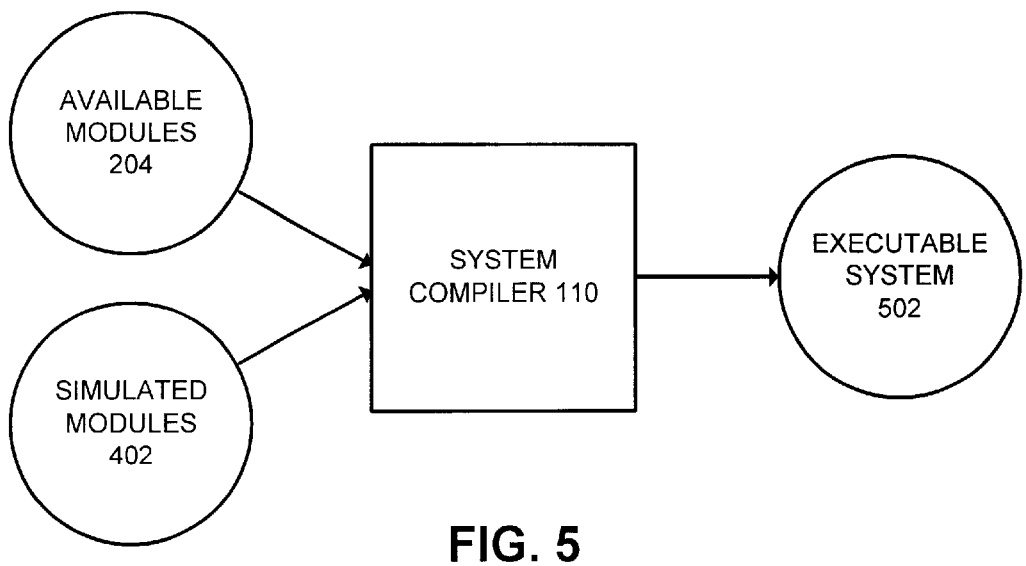
FIG. 5 illustrates system compiler 110 in accordance with an embodiment of the present invention.

FIG. 5 illustrates system compiler 110 in accordance with an embodiment of the present invention. System compiler 110 receives available modules 204 and simulated modules 402 and uses these inputs to generate executable system 502. System compiler 110 replaces nonfunctioning modules from available modules 204 with simulated modules from simulated modules 402 to create a system that can be compiled by system compiler 110.

Execution Unit 112

Figure 6:
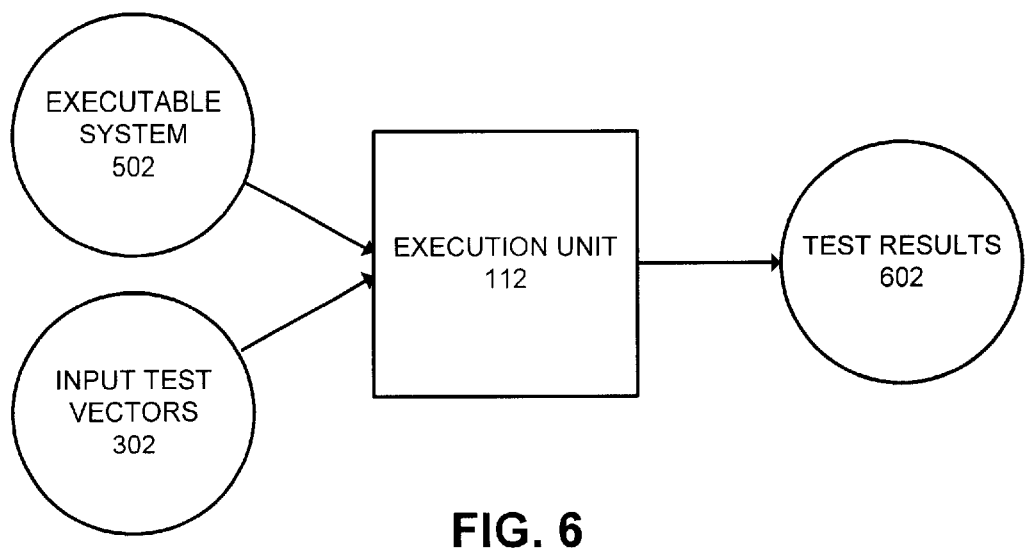
FIG. 6 illustrates execution unit 112 in accordance with an embodiment of the present invention.

FIG. 6 illustrates execution unit 112 in accordance with an embodiment of the present invention. Execution unit 112 receives executable system 502 from system compiler 110 and input test vectors 302. Execution unit 112 exercises executable system 502 by applying input test vectors 302 and capturing the results as test results 602. A test engineer can then examine test results 602 to determine if executable system 502 responds as specified in system specification 202 and can possibly determine the source of errors within executable system 502.

Creating a Testable System

Figure 7:
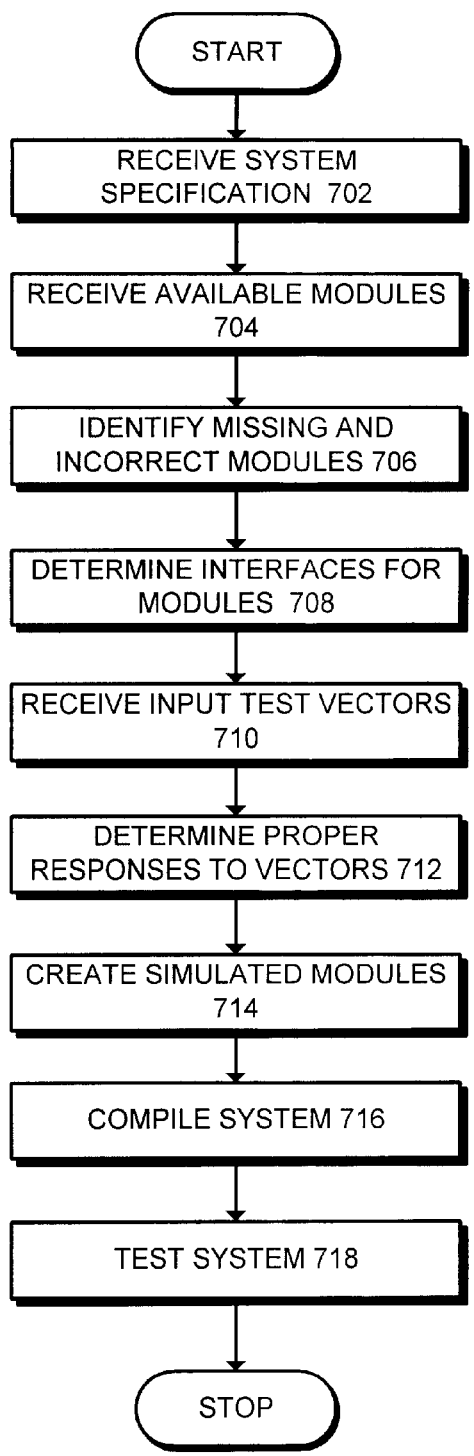
FIG. 7 is a flowchart illustrating the process of creating a testable system using simulation modules in accordance with an embodiment of the present invention.

FIG. 7 is a flowchart illustrating the process of creating a testable system using simulation modules in accordance with an embodiment of the present invention. The system starts when parser 104 receives system specification 202 (step 702). Next, parser 104 receives available modules 204 (step 704).

Parser 104 then uses system specification 202 and available modules 204 to identify nonfunctioning modules including missing and incorrect modules (step 706). Parser 104 also determines the interfaces for these nonfunctioning modules (step 708).

Response generator 106 receives input test vectors 302 (step 710). Response generator 106 uses input test vectors 302 and system specification 202 to determine the proper responses to input test vectors 302 (step 712). These proper responses are stored in captured responses 304. Next, model generator 108 uses list of nonfunctioning modules 206, interface definitions for nonfunctioning modules 208, and captured responses 304 to create simulated modules 402 (step 714).

System compiler 110 creates executable system 502 using available modules 204 and simulated modules 402 (step 716). Finally, execution unit 112 uses executable system 502 and input test vectors 302 to create test results 602 (step 718). A test engineer can then examine test results 602 to determine if the completed modules are functioning correctly.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for generating a simulation module to facilitate testing a system design, comprising:
   receiving a system specification specifying correct behavior for modules within the system design;
   receiving a plurality of modules that are individually designed to the system specification;
   comparing the plurality of modules with the system specification to identify a nonfunctioning module, wherein the nonfunctioning module includes either a missing module or an incorrect module;
   determining from the system specification an interface specifying input and output requirements for the nonfunctioning module; and
   generating the simulation module, wherein the simulation module replaces the nonfunctioning module in the system design, and wherein the simulation module can function in place of the nonfunctioning module and simulate a functionality assigned to the nonfunctioning module.

2. The method of claim 1, further comprising:
   receiving a list of test vectors;
   applying the list of test vectors to the system specification;
   capturing a response of the system specification to the list of test vectors; and
   simulating the response to the list of test vectors within the simulation module.

3. The method of claim 2, further comprising:
   replacing the nonfunctioning module with the simulation module;
   compiling the plurality of modules including the simulation module into an executable system; and
   executing the executable system, wherein executing the executable system allows testing of completed modules.

4. The method of claim 3, further comprising testing the executable system with the list of test vectors.

5. The method of claim 2, wherein capturing the response of the system specification to the list of test vectors includes capturing an output of the system specification to a specified input test stimulus.

6. The method of claim 1, wherein the nonfunctioning module can be identified manually.

7. The method of claim 1, wherein the interface for the nonfunctioning module includes input/output and inter-module data transfers.

8. A computer-readable storage medium storing instructions that when executed by a computer cause the computer to perform a method for generating a simulation module to facilitate testing a system design, the method comprising:
   receiving a system specification specifying correct behavior for modules within the system design;
   receiving a plurality of modules that are individually designed to the system specification;
   comparing the plurality of modules with the system specification to identify a nonfunctioning module, wherein the nonfunctioning module includes either a missing module or an incorrect module;
   determining from the system specification an interface specifying input and output requirements for the nonfunctioning module; and
   generating the simulation module, wherein the simulation module replaces the nonfunctioning module in the system design, and wherein the simulation module can function in place of the nonfunctioning module and simulate a functionality assigned to the nonfunctioning module.

9. The computer-readable storage medium of claim 8, the method further comprising:
   receiving a list of test vectors;
   applying the list of test vectors to the system specification;
   capturing a response of the system specification to the list of test vectors; and
   simulating the response to the list of test vectors within the simulation module.

10. The computer-readable storage medium of claim 9, the method further comprising:
    replacing the nonfunctioning module with the simulation module;
    compiling the plurality of modules including the simulation module into an executable system; and
    executing the executable system, wherein executing the executable system allows testing of completed modules.

11. The computer-readable storage medium of claim 10, the method further comprising testing the executable system with the list of test vectors.

12. The computer-readable storage medium of claim 9, wherein capturing the response of the system specification to the list of test vectors includes capturing an output of the system specification to a specified input test stimulus.

13. The computer-readable storage medium of claim 8, wherein the nonfunctioning module can be identified manually.

14. The computer-readable storage medium of claim 8, wherein the interface for the nonfunctioning module includes input/output and inter-module data transfers.

15. An apparatus for generating a simulation module to facilitate testing a system design, comprising:
    a receiving mechanism that is configured to receive a system specification specifying correct behavior for modules within the system design;
    wherein the receiving mechanism is further configured to receive a plurality of modules that are individually designed to the system specification;
    a comparing mechanism that is configured to compare the plurality of modules with the system specification to identify a nonfunctioning module, wherein the nonfunctioning module includes either a missing module or an incorrect module;
    a determining mechanism that is configured to determine from the system specification an interface specifying input and output requirements for the nonfunctioning module; and
    a generating mechanism that is configured to generate the simulation module at a different level of abstraction;
    wherein the simulation module replaces the nonfunctioning module in the system design, and wherein the simulation module can function in place of the nonfunctioning module and simulate a functionality assigned to the nonfunctioning module.

16. The apparatus of claim 15, wherein the simulation module is specified at a higher level of abstraction than the nonfunctioning module.

17. The apparatus of claim 15, wherein the simulation module is written in a specification language different than a language of the nonfunctioning module.

18. The apparatus of claim 15, wherein the receiving mechanism is further configured to receive a list of test vectors, and the apparatus further comprises;
 a vector application mechanism that is configured to apply the list of test vectors to the system specification;
 a capturing mechanism that is configured to capture a response of the system specification to the list of test vectors; and
 a simulating mechanism that is configured to simulate the response to the list of test vectors within the simulation module.

19. The apparatus of claim 18, further comprising:
 a replacing mechanism that is configured to replace the nonfunctioning module with the simulation module;
 a compiling mechanism that is configured to compile the plurality of modules including the simulation module into an executable system; and
 an executing mechanism that is configured to execute the executable system, wherein executing the executable system allows testing of completed modules.

20. The apparatus of claim 19, wherein if the compiling mechanism includes a plurality of compiling mechanisms that are not compatible at a machine language level, the apparatus further comprises:
 a plurality of adaptors, wherein the plurality of adaptors provide interoperability at the machine language level; and
 a scheduling mechanism that is configured to schedule binary objects that are provided by the plurality of compiling mechanisms.

21. The apparatus of claim 19, further comprising a testing mechanism that is configured to test the executable system with the list of test vectors.

22. The apparatus of claim 21, wherein capturing the response of the system specification to the list of test vectors includes capturing an output of the system specification to a specified input test stimulus.

23. The apparatus of claim 15, wherein the nonfunctioning module can be identified manually.

24. The apparatus of claim 15, wherein the interface for the nonfunctioning module includes input/output and inter-module data transfers.

* * * * *